United States Patent
Flachowsky et al.

(10) Patent No.: US 8,586,440 B2
(45) Date of Patent: Nov. 19, 2013

(54) METHODS FOR FABRICATING INTEGRATED CIRCUITS USING NON-OXIDIZING RESIST REMOVAL

(75) Inventors: Stefan Flachowsky, Dresden (DE); Steven Langdon, Dresden (DE); Thomas Feudel, Radebeul (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 215 days.

(21) Appl. No.: 13/192,332

(22) Filed: Jul. 27, 2011

(65) Prior Publication Data

US 2013/0029464 A1 Jan. 31, 2013

(51) Int. Cl.
*H01L 21/336* (2006.01)

(52) U.S. Cl.
USPC ............ 438/301; 438/199; 438/216; 438/230

(58) Field of Classification Search
USPC ......... 257/144, 190, 255, 351, 368, 369, 408; 438/153, 216, 230, 257, 300, 303, 514, 438/531, 301
See application file for complete search history.

(56) References Cited

U.S. PATENT DOCUMENTS

| 2007/0148888 A1* | 6/2007 | Krull et al. | 438/306 |
| 2007/0178637 A1* | 8/2007 | Jung et al. | 438/216 |
| 2009/0065807 A1* | 3/2009 | Fujimoto | 257/190 |
| 2010/0129971 A1* | 5/2010 | Ohta et al. | 438/230 |

* cited by examiner

*Primary Examiner* — Kimberly Rizkallah
*Assistant Examiner* — Errol Fernandes
(74) *Attorney, Agent, or Firm* — Ingrassia Fisher & Lorenz, P.C.

(57) ABSTRACT

Methods are provided for fabricating integrated circuits using non-oxidizing resist removal. In accordance with one embodiment the method includes forming a gate electrode structure overlying a semiconductor substrate and applying and patterning a layer of resist to expose a portion of the semiconductor substrate adjacent the gate electrode structure. Conductivity determining ions are implanted into the semiconductor substrate using the gate electrode structure and the layer of resist as an implant mask. The layer of resist is removed in a non-oxidizing ambient and the implanted conductivity determining ions are activated by thermal annealing.

18 Claims, 6 Drawing Sheets

METHODS FOR FABRICATING INTEGRATED CIRCUITS USING NON-OXIDIZING RESIST REMOVAL

TECHNICAL FIELD

The present invention generally relates to methods for fabricating integrated circuits, and more particularly relates to methods for fabricating integrated circuits using non-oxidizing resist removal.

BACKGROUND

The trend in integrated circuit (IC) fabrication is to incorporate more and more circuitry on a single IC chip and to simultaneously improve the performance of the circuit. Scaling of device dimensions is the key for the success and enormous momentum of this semiconductor industry trend. Simple scaling of all device dimensions, reducing feature size and spacing, however, is increasingly difficult to achieve because physical limitations hinder further reduction.

One important dimension that must be considered in the scaling process is the depth and lateral extent of doped regions. Ion implantation is the process of choice for forming doped regions because of its high accuracy, reproducibility, and ability to provide very high concentrations of dopants in shallow layers. The ideal is a "diffusionless" transistor that allows a reduction of lateral device dimensions for high packing density circuits. The diffusionless transistor is difficult to realize, even with ion implantation, however, because the implanted dopant ions must be annealed. Annealing is required both to activate the implanted ions and to heal defects caused by the implantation process. Techniques have been developed to activate the implanted ions with minimal diffusion of the implant profile, for example by millisecond annealing, but such techniques are difficult to employ, require additional processing steps, and are not effective for healing defects. Additionally, such techniques are not compatible with the usual stress application techniques used to enhance device performance.

Accordingly, it is desirable to provide methods for integrated circuit fabrication that are compatible with device scaling. In addition, it is desirable to provide methods for fabricating ICs that have controlled dopant profiles and that are compatible with stress elements for performance enhancement. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuits using non-oxidizing resist removal. In accordance with one embodiment the method includes forming a gate electrode structure overlying a semiconductor substrate and applying and patterning a layer of resist to expose a portion of the semiconductor substrate adjacent the gate electrode structure. Conductivity determining ions are implanted into the semiconductor substrate using the gate electrode structure and the layer of resist as an implant mask. The layer of resist is removed in a non-oxidizing ambient and the implanted conductivity determining ions are activated by thermal annealing.

In accordance with a further embodiment, a method includes applying a layer of photoresist overlying a silicon substrate and patterning the layer of photoresist to form an ion implantation mask exposing surface portions of the silicon substrate. Conductivity determining ions are implanted into the surface portions of the silicon substrate through the ion implantation mask. The ion implantation mask and the surface portion of the silicon substrate are subjected to an atmosphere comprising hydrogen and nitrogen to remove the ion implantation mask and to nitride the surface portion.

In yet another embodiment a method for fabricating an integrated circuit includes forming a gate electrode structure overlying a silicon substrate and embedding a region of silicon germanium into the silicon substrate in alignment with the gate electrode structure. A layer of resist material is applied and patterned overlying the silicon substrate and exposing a surface portion of the region of silicon germanium. N-type conductivity determining ions are implanted into the silicon substrate underlying a portion of the gate electrode structure using the layer of resist material as an ion implantation mask, and P-type conductivity determining ions are implanted into the region of silicon germanium using the layer of resist material and the gate electrode structure as an ion implantation mask. The layer of resist material and the surface portion of the region of silicon germanium are exposed to a non-oxidizing plasma comprising hydrogen and nitrogen to remove the layer of resist material and to form a nitride layer on the surface portion of the region of silicon germanium. The silicon substrate is thermally annealed to activate the implanted ions.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

Many of the steps undertaken in the fabrication of an integrated circuit (IC) involve the formation of a mask, either an etch mask or an implantation mask. Such a mask is formed by applying a layer of photoresist (a photosensitive organic material) overlying the surface of a silicon substrate. Portions of the layer of photoresist are exposed to electromagnetic radiation by directing the electromagnetic radiation through a patterned lithographic mask. The radiation causes a chemical or physical change in the layer of photoresist so that one portion of the layer becomes more soluble than the rest of the layer. The more soluble portion is removed upon exposure to a developer to leave a patterned mask. After using the patterned mask for its intended purpose, such as for an ion implantation mask, the mask must be removed so that subsequent processing steps can be applied to the silicon substrate.

The conventional and most common method for removing a photoresist mask is by "ashing" in which the photoresist material is oxidized by exposure to an oxygen plasma. Although ashing is effective in removing the patterned photoresist mask, during the removal process any exposed surface of the silicon substrate is oxidized by the oxygen plasma.

The oxidation of the silicon substrate causes defects such as silicon self-interstitials in the top layer of the silicon. The inventors have determined that the release of silicon interstitials during subsequent thermal treatments causes transient-enhanced diffusion of dopant ions and deactivates previously activated dopants. Boron and phosphorous are conductivity determining dopants known to diffuse by interstitials and arsenic, also a conductivity determining dopant, is known to diffuse by both interstitial and vacancy mediated processes. This means that the diffusion of these dopants is enhanced as a result of the interstitials formed by the oxidizing plasma ashing process. The enhanced diffusion works against the goal of achieving shallow junctions with steep dopant profiles that are desirable for, among other objectives, short channel control.

FIGS. 1-11 illustrate schematically, in cross sectional views, methods in accordance with various embodiments for fabricating a semiconductor integrated circuit 100 by using non-oxidizing photoresist removal processes. By using a non-oxidizing photoresist removal process the problems encountered with the prior art oxidizing removal process can be avoided. IC 100 may include many transistors, both N-Channel MOS transistors (NMOSTs) and P-channel MOS transistors (PMOSTs), but only a single PMOST 102 and a single NMOST 104 will be illustrated in the FIGURES. Various steps in the manufacture of ICs are well known and so, in the interest of brevity, many conventional steps will only be mentioned briefly herein or will be omitted entirely without providing the well known process details. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
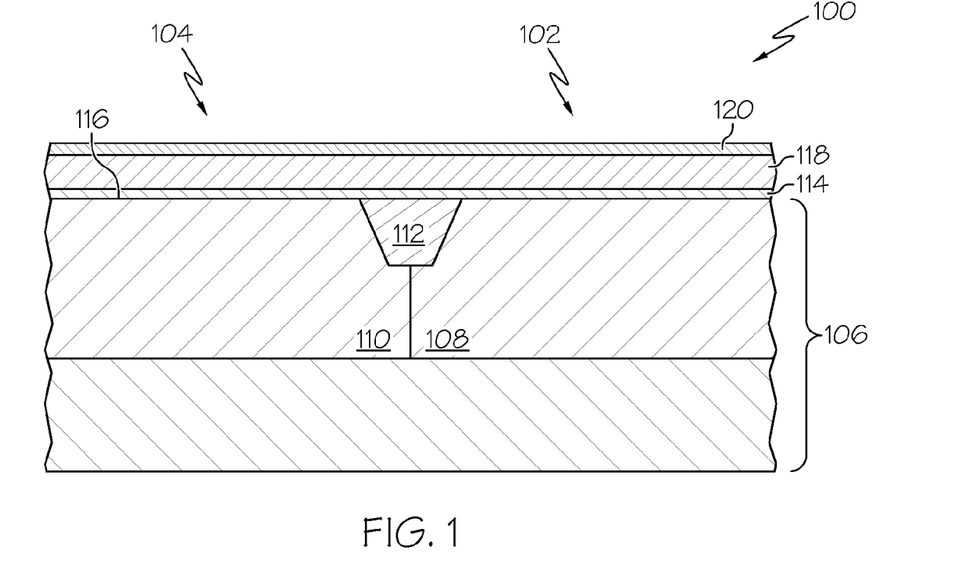
FIGS. 1-11 schematically illustrate, in cross sectional views, method steps for the fabrication of integrated circuits in accordance with various embodiments.

Methods for fabricating IC 100 in accordance with one embodiment start, as illustrated in FIG. 1, by providing a semiconductor substrate 106. Semiconductor substrate 106 can be, for example, silicon, silicon admixed with germanium, silicon admixed with carbon, or other semiconductor materials commonly used for the manufacture of integrated circuits, but will hereinafter be referred to for convenience, but without limitation, as a silicon substrate. Silicon substrate 106 can be a bulk substrate, as illustrated, or can be a semiconductor on insulator substrate (SOI). Silicon substrate 106 includes an N-type well region 108 in and on which PMOST 102 will be formed and a P-type well region 110 in and on which NMOST 104 will be formed. The two well regions are electrically isolated by, for example, shallow trench isolation (STI) 112. The impurity doping concentration and profile in the well regions 108 and 110 can be established, for example, by ion implantation of N-type and P-type conductivity determining ions, respectively. More than one ion implantation may be used for each well to establish the desired profile needed for the integrated circuit being implemented. STI 112 can be formed in known manner by etching a trench and refilling the trench with silicon oxide or other insulator.

As also illustrated in FIG. 1, a gate insulator layer 114 is formed overlying surface 116 of the silicon substrate. Gate insulator layer 114 can be thermally grown silicon dioxide, a high-k dielectric material such as a hafnium oxide, combinations of the two, or other insulating material. Although illustrated as a single layer, the gate insulator can be a layered structure and can be a different material or combination of materials overlying the two wells. Overlying the gate insulator layer is a deposited layer of gate electrode material 118 such as polycrystalline or amorphous silicon, a metal, other conductive material, or combinations thereof. As with the gate insulator layer, the layer of gate electrode material, although illustrated as a single layer, need not be the same material overlying both of the wells. A layer of hard mask material 120, such as a layer of silicon nitride, is deposited overlying the layer of gate electrode material.

Figure 2:
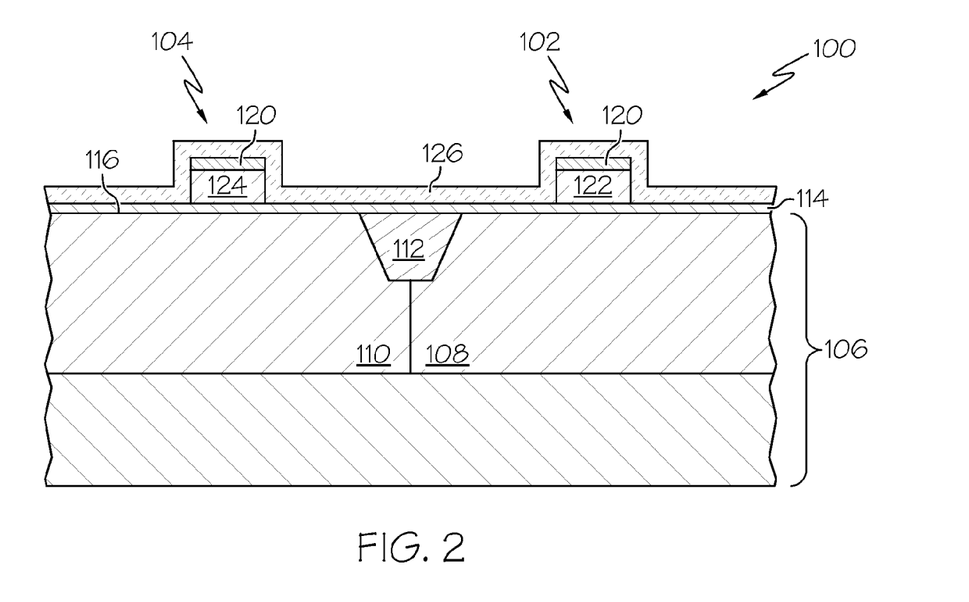

The method for fabricating an IC in accordance with an embodiment continues, as illustrated in FIG. 2, by patterning the layer of hard mask material 120 and the layer of gate electrode material 118 to form conductive gate electrodes 122 and 124 overlying well regions 108 and 110, respectively. Conductive gate electrode 122 is the gate electrode of PMOST 102 and conductive gate electrode 124 is the gate electrode of NMOST 104. The layer of gate electrode material can be patterned by conventional photolithography and etch techniques. The layer of photoresist used in the patterning process can be removed by conventional plasma ashing, or, in accordance with one embodiment, by exposing the photoresist layer to a non-oxidizing plasma that includes hydrogen and nitrogen species as the reactants. Specifically, the plasma reactants can be, for example, forming gas (hydrogen combined with nitrogen), ammonia, or forming gas combined with ammonia. In accordance with one embodiment the plasma reactants include, for example, forming gas and ammonia in a ratio of about 20 ammonia to 1 forming gas. Primarily for safety reasons, the forming gas is preferably nitrogen rich (for example about 90% nitrogen) to reduce the danger from explosive mixtures. Following the patterning of the conductive gate electrodes, a layer of sidewall spacer material 126 is blanket deposited as illustrated. The layer of sidewall spacer material can be silicon oxide, silicon nitride, or the like.

Figure 3:
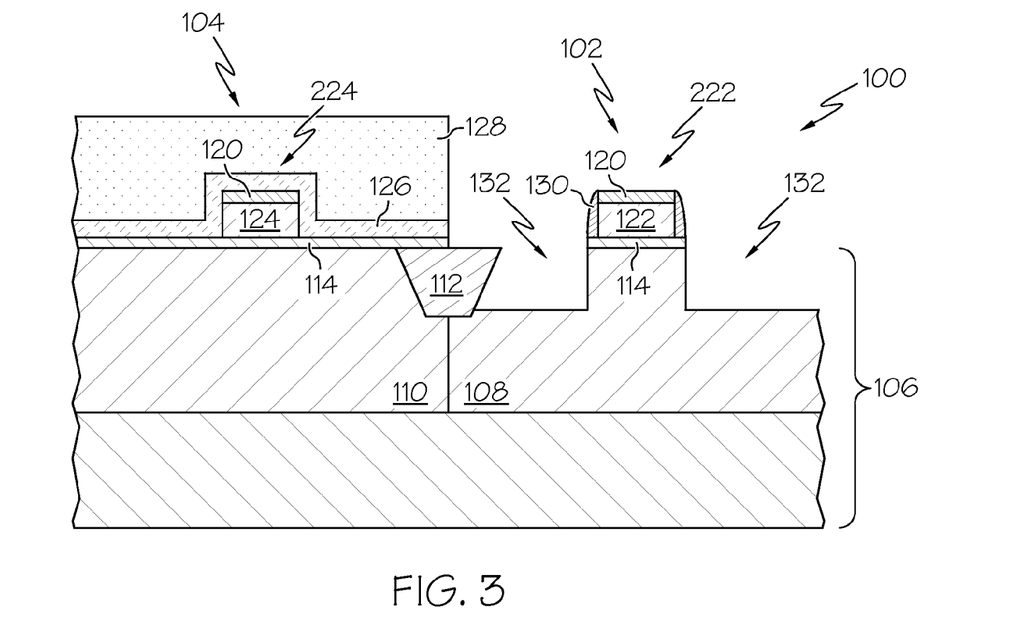

As illustrated in FIG. 3, the method continues in accordance with one embodiment by applying and patterning a layer of photoresist 128 overlying the layer of sidewall spacer material. The patterned layer of photoresist serves to protect NMOST 104 while exposing PMOST 102. The layer of patterned photoresist is used as an etch mask as the layer of sidewall spacer material is anisotropically etched, for example by reactive ion etching (RIE), to form sidewall spacers 130 on the sidewalls of conductive gate electrode 122. The conductive gate electrodes 122 and 124, underlying gate insulating layer 114 and any associated sidewall spacers will hereinafter be referred to as gate electrode structures 222 and 224. The gate electrode structure 222, together with patterned layer of photoresist 128, is used as an etch mask to etch recesses 132 into N-type well region 108. The recesses are etched by RIE or other anisotropic etch technique. By using gate electrode structure 222 as part of the etch mask, the recess is etched in alignment with the gate electrode. The patterned layer of photoresist is removed following the etching of recesses 132. The photoresist can be removed by either an oxidizing or a non-oxidizing removal process.

Figure 4:
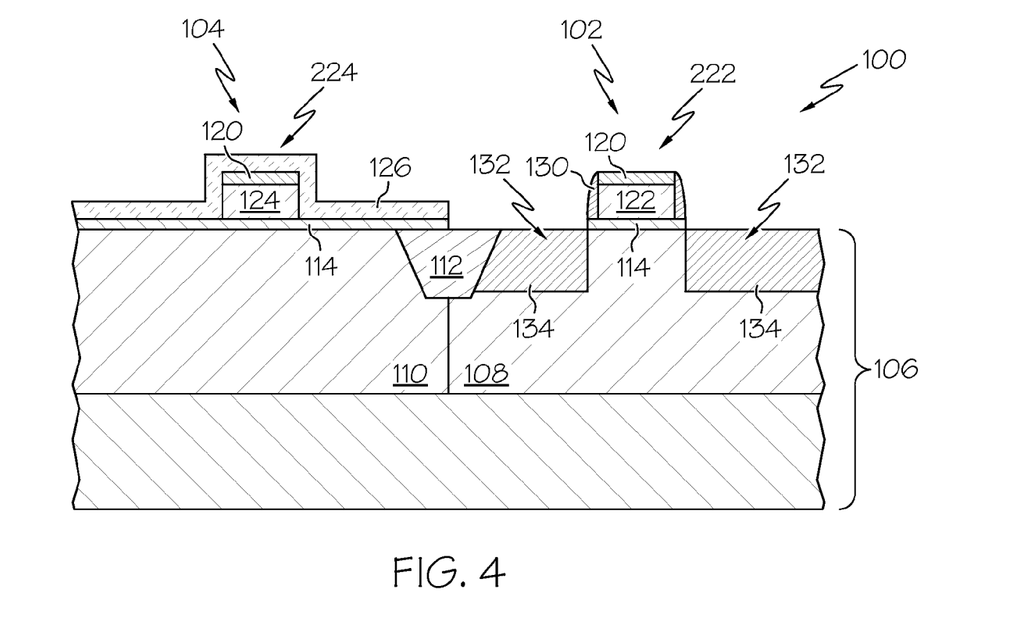

This embodiment continues, after the removal of patterned layer of photoresist 128, by the selective epitaxial growth of embedded silicon germanium (eSiGe) 134 to fill recesses 132 as illustrated in FIG. 4. The eSiGe exerts a compressive strain on the channel of PMOST 102 to enhance the mobility of majority carrier holes in the channel. In the selective epitaxial growth process the reactants and growth conditions are adjusted to cause the silicon germanium to grow only on regions of exposed crystalline silicon.

Figure 5:
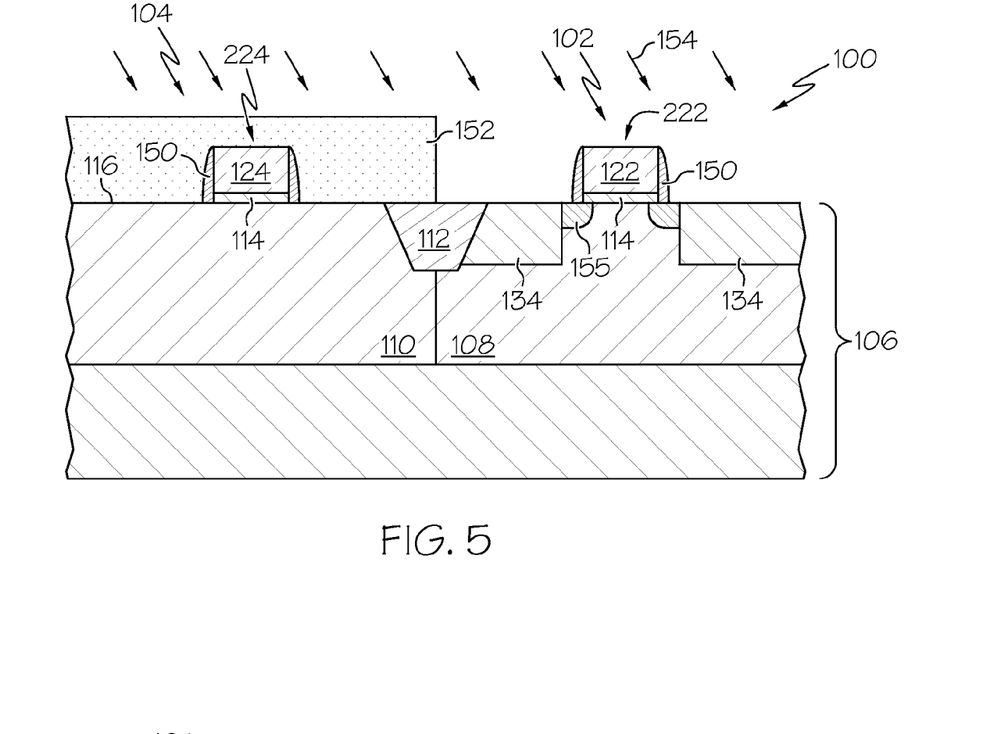

Sidewall spacers 130 and the remaining portions of the layer of sidewall spacer material 126 and hard mask 120 are removed and new sidewall spacers 150 are formed on the sidewalls of conductive gate electrodes 122 and 124 as illustrated in FIG. 5. The spacers can be formed, for example, by depositing and anisotropically etching a layer of silicon oxide. A layer of photoresist 152 is applied and patterned to form an ion implantation mask protecting NMOST 104 and exposing PMOST 102 and particularly a portion of the silicon substrate adjacent gate electrode structure 222. Using the patterned photoresist layer together with gate electrode structure 222 as an ion implantation mask, N-type conductivity determining ions such as arsenic ions are implanted into the surface of eSiGe region 134 and N-type well region 108. The ion implantation is performed at an angle as illustrated by arrows 154 to implant the ions into an N-type halo region 155 under the edge of gate electrode structure 222. As is well known, although not illustrated, multiple implants at different angles may be needed to insure that the halo implant underlies the edges of the gate electrode structure regardless of the orientation of the structure.

Figure 6:
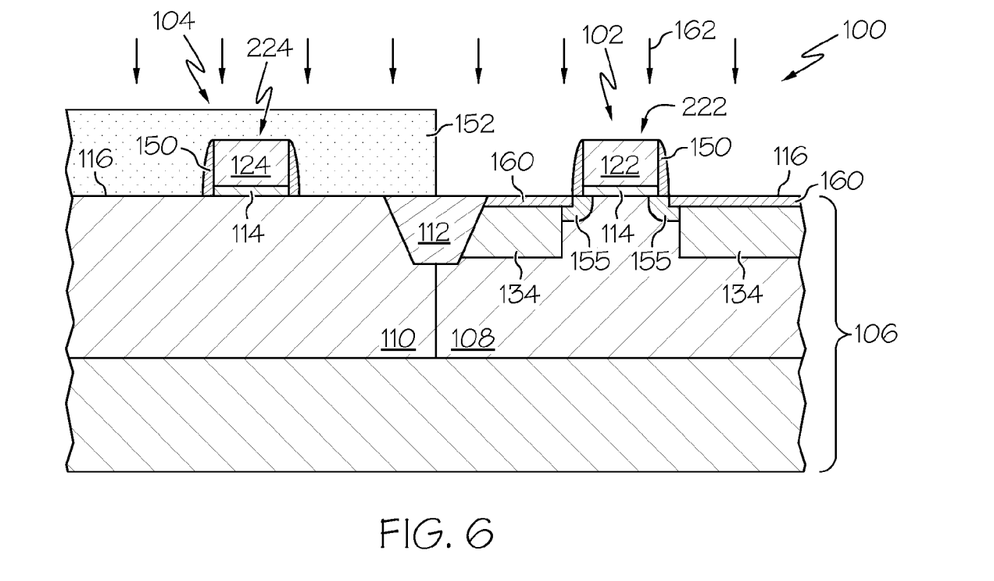

As illustrated in FIG. 6, the method in accordance with an embodiment continues by implanting P-type conductivity determining ions such as boron ions into the surface of eSiGe region 134 to form P-type source and drain extensions 160. The ion implantation is masked by the same patterned layer of photoresist 152 and gate electrode structure 222. This ion implantation is performed substantially perpendicular to the surface 116 of silicon substrate 106 as illustrated by arrows 162.

Figure 7:
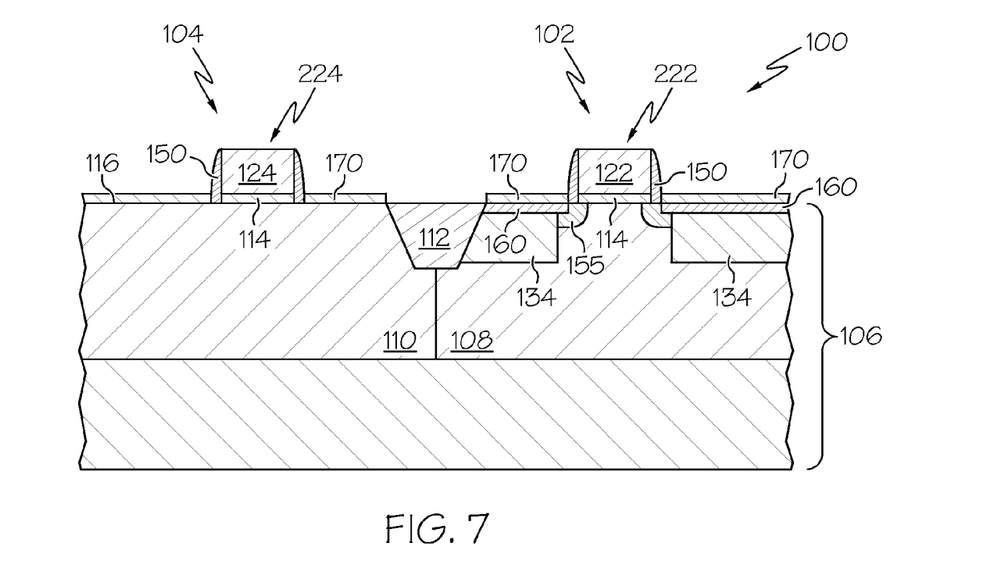

Following the ion implantation steps the patterned layer of photoresist is removed. It is important, for reasons explained above, that the photoresist layer be removed in a non-oxidizing ambient. Preferably the layer of photoresist is removed in a non-oxidizing plasma ambient using reactants including hydrogen and nitrogen to both remove the photoresist material and to form a nitride layer 170 at the surface of the embedded silicon germanium and N-type well as illustrated in FIG. 7. The non-oxidizing plasma reactants can include, for example, ammonia, forming gas, or ammonia combined with forming gas. Nitride layer 170 may also form on the surface of P-type well region 110. The inventors have determined that the formation of a nitride layer at the surface of the implanted silicon and silicon germanium introduces vacancies in the highly doped surface which act to retard dopant diffusion. Retarding dopant diffusion both laterally and away from the surface leads to control of the dopant junction and results in a steep junction profile. Retarding lateral diffusion of the implanted dopant ions reduces gate-to-drain and gate-to-source overlap which, in turn, results in better short channel control and lowered Miller capacitance.

Figure 8:
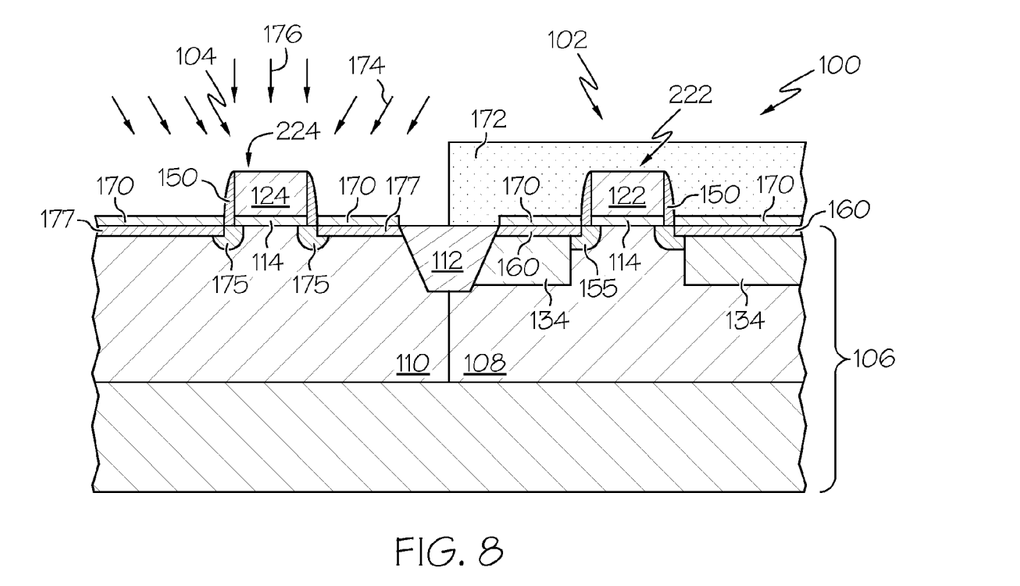

Although not illustrated in detail, in accordance with one embodiment halo regions and source and drain extensions are formed on NMOST 104 in a similar manner. As illustrated in FIG. 8, a layer of photoresist 172 is applied and patterned to form an ion implantation mask protecting PMOST 102 and exposing NMOST 104. Using the patterned layer of photoresist together with gate electrode structure 224 as an ion implantation mask, P-type conductivity determining ions such as boron ions are implanted into the surface of P-type well region 110. As with the implantation of PMOST 102 this ion implantation is performed at an angle as illustrated by arrows 174 to implant the ions into a P-type halo region 175 under the edge of gate electrode structure 224. Using the same ion implantation mask, N-type conductivity determining ions such as arsenic ions are implanted into the surface of the P-type well region as illustrated by arrows 176 to form source and drain extensions 177 of NMOST 104. After completing the halo and extension implants patterned layer of photoresist 172 is removed in the same manner and for the same reasons as was photoresist layer 152. Removing the layer of photoresist in a non-oxidizing ambient containing nitrogen causes a nitride layer 170 to form on the surface of P-well region 110 if the layer was not already formed during the previous removal of photoresist layer 152.

Figure 9:
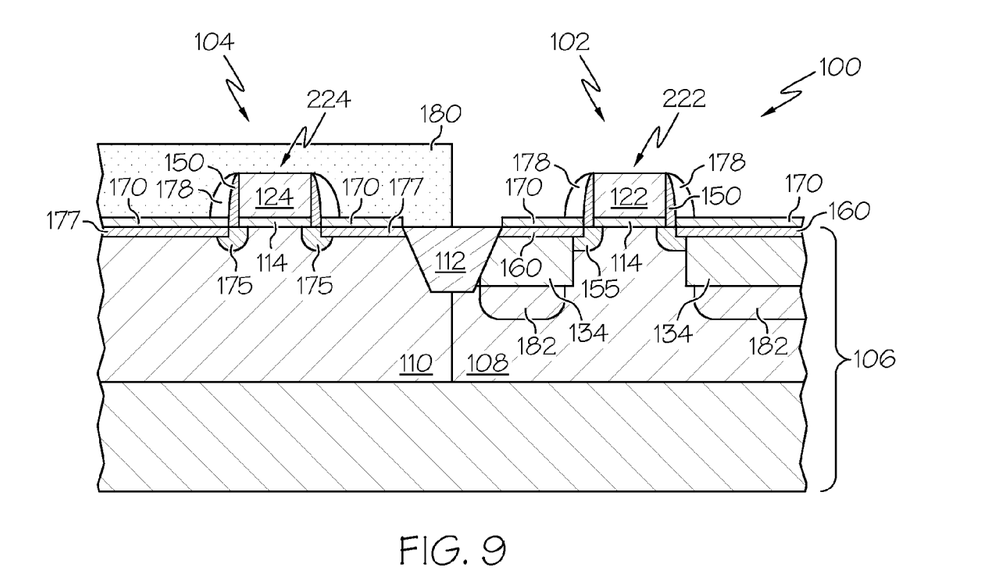

Methods for fabricating an integrated circuit continue in accordance with one embodiment by forming additional sidewall spacers 178 on the sidewalls of gate electrode structures 222 and 224 as illustrated in FIG. 9. The sidewall spacers are formed of oxide, nitride, or other insulating material by depositing and then anisotropically etching a layer of sidewall spacer forming material. A layer 180 of photoresist is then applied and patterned to again form an ion implantation mask that protects NMOST 104 and exposes PMOST 102. P-type conductivity determining ions such as boron ions are implanted into and through eSiGe region 134 and into N-well region 108 to form deep source and drain regions 182.

Figure 10:
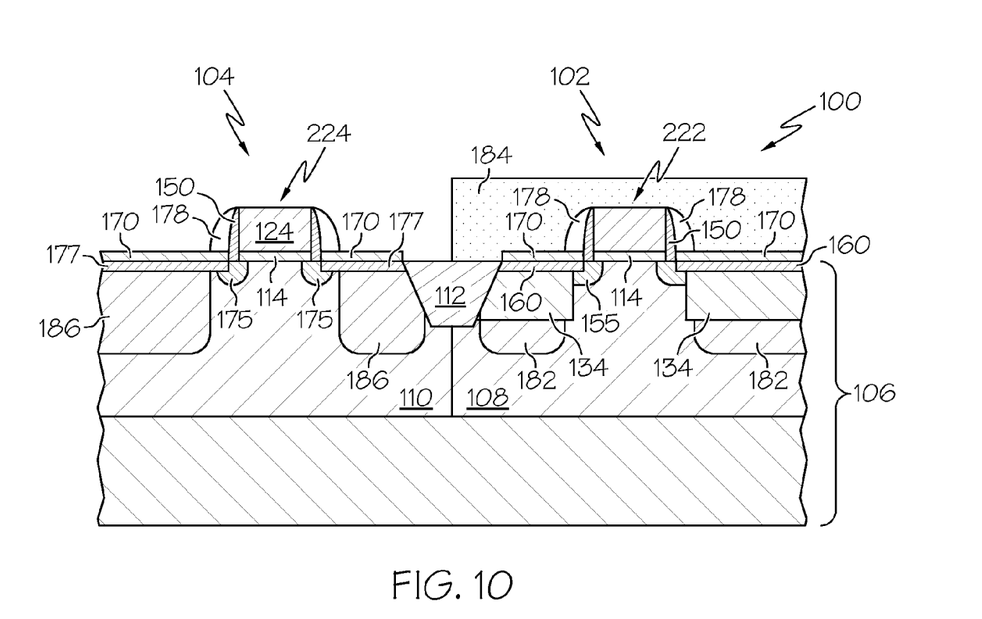

Patterned layer 180 of photoresist is removed, again by a non-oxidizing removal process as described above, and another layer 184 is applied and patterned to protect PMOST 102 and to expose NMOST 104 as illustrated in FIG. 10. Patterned layer 184, together with gate electrode structure 224, is used as an ion implantation mask and N-type conductivity determining ions such as arsenic ions are implanted into P-well region 110 to form the deep source and drain regions 186 of NMOST 104. Following the implantation of source and drain regions 186, patterned layer 184 is removed, again by a non-oxidizing removal process.

In order activate the implanted ions and to repair lattice damage caused by the implantations, silicon substrate 106 must be thermally annealed. Thermal annealing can be carried out after each of the individual ion implantations, but it is preferred that the annealing take place after all of the implantations are completed so as to minimize the thermal budget. Because the various layers of photoresist have been removed in a non-oxidizing ambient so that the substrate surface has not been oxidized and instead has been nitrided, the thermal annealing can be done in a normal manner. Preferably the annealing is done in conventional manner by a spike rapid thermal anneal (RTA) rather than by the less effective millisecond anneal. As a result of processing the various photoresist layers in this manner, shallow, abrupt, substantially diffusionless implanted regions are achieved.

Figure 11:
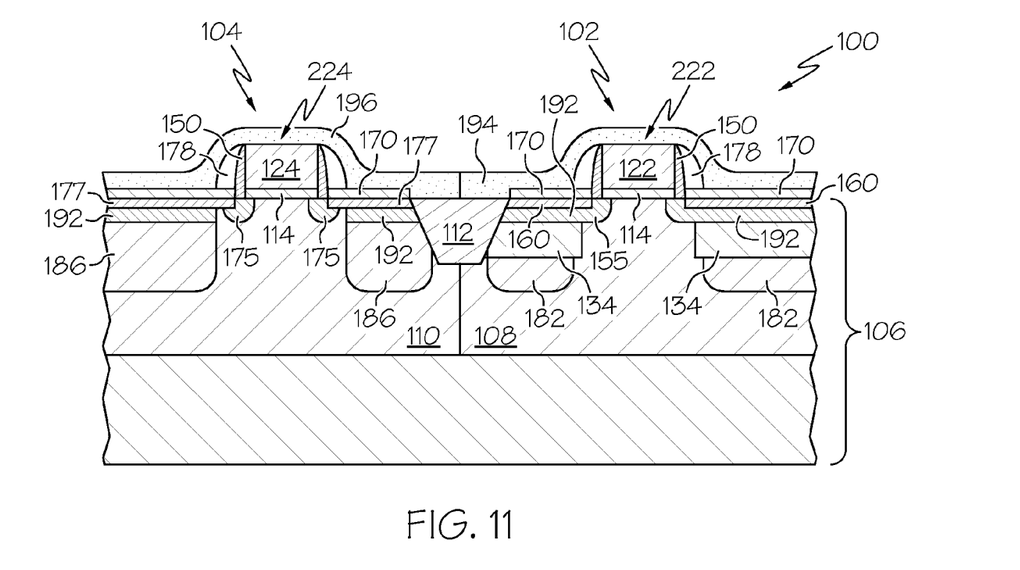

Following the thermal activation of the implanted regions, processing of IC 100 can proceed in the normal manner. For example, as illustrated in FIG. 11, metal silicide contacts 192 to source and drain regions 182 and 186 can be formed. The metal silicide contacts can be formed, for example, by depositing a layer of nickel or other silicide forming metal and heating to cause the metal to react with exposed silicon in the source and drain regions. Additionally, in accordance with one embodiment strained insulating layers such as strained silicon nitride layers can be deposited overlying transistors 102 and 104 to increase the mobility of majority carriers in the channels of those devices. A compressive strain layer of silicon nitride 194 can be deposited overlying PMOST 102 and a tensile strain layer of silicon nitride 196 can be deposited overlying NMOST 104. The strain layers can be deposited, for example, by plasma enhanced chemical vapor deposition. The proper strain type, either compressive or tensile, is achieved in known manner by adjusting the reactant composition and deposition conditions.

Although not illustrated in any of the figures, the achievement of shallow, abrupt dopant junctions can also be enhanced by co-implanting either carbon or fluorine with the N-type and P-type conductivity determining dopant ions.

Although helpful, the use co-implantation by itself, without the use of non-oxidizing resist removal, is not sufficient to achieve the desired result.

The use of a non-oxidizing photoresist removal process, in accordance with the various embodiments described above, allows a reduction in the gate length of the MOS transistors because the short channel effects can be better controlled in contrast to processing using an oxidizing photoresist removal process. MOS transistors fabricated using a non-oxidizing photoresist removal process have been experimentally demonstrated to have Miller capacitance reduced by 20 atto farads (aF) and short channel behavior (threshold voltage versus gate length behavior) improved by 4 nanometers at matched long channel threshold voltage in comparison to otherwise identical MOS transistors fabricated using an oxidizing photoresist removal process. Because of the benefits achieved using a non-oxidizing photoresist removal process in contrast to conventional processing, transistors can be designed and fabricated with reduced channel lengths without incurring problems with threshold voltage drops or increased short channel leakage. Shorter channel lengths result in higher drive current and higher switching speed of the transistors (conductance and transconductance are both inversely proportional to channel length) and also allow further scaling of the circuits in which the transistors are designed to allow more transistors on a given silicon area.

While exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
    forming a gate electrode structure overlying a semiconductor substrate;
    applying and patterning a layer of resist to expose a portion of the semiconductor substrate adjacent the gate electrode structure;
    implanting conductivity determining ions into the semiconductor substrate using the gate electrode structure and the layer of resist as an implant mask;
    removing the layer of resist in a non-oxidizing ambient; and
    activating the implanted conductivity determining ions by thermal annealing,
    wherein removing the layer of resist comprises exposing the layer of resist to a plasma environment comprising reactants selected from the group consisting of ammonia, hydrogen combined with nitrogen, and combinations thereof, and
    wherein exposing the layer of resist to a plasma environment further comprises exposing the portion of the semiconductor substrate to a plasma environment to form a nitride layer thereon.

2. The method of claim 1 wherein the semiconductor substrate comprises a silicon well region of first conductivity type and wherein implanting conductivity determining ions comprises implanting first ions of the first conductivity type to form a halo region underlying the gate electrode structure and implanting second ions of second conductivity type opposite the first conductivity type to form source and drain extensions.

3. The method of claim 2 further comprising implanting third ions of second conductivity type to form deep source and drain regions before activating the implanted conductivity determining ions.

4. The method of claim 1 wherein the semiconductor substrate comprises an N-type silicon well region, the method further comprising embedding silicon germanium in the N-type silicon well region.

5. The method of claim 1 further comprising co-implanting ions selected from the group consisting of carbon and fluorine with the conductivity determining ions.

6. The method of claim 1 wherein activating the implanted conductivity determining ions comprises heating the semiconductor substrate by a spike rapid thermal anneal.

7. The method of claim 1 further comprising overlaying the gate electrode structure with a stressed insulating layer.

8. A method for fabricating an integrated circuit comprising:
    applying a layer of photoresist overlying a silicon substrate;
    patterning the layer of photoresist to form an ion implantation mask exposing surface portions of the silicon substrate;
    implanting conductivity determining ions into the surface portions of the silicon substrate through the ion implantation mask;
    exposing the ion implantation mask and the surface portion of the silicon substrate to a non-oxidizing atmosphere comprising hydrogen and nitrogen to remove the ion implantation mask and to nitride the surface portion.

9. The method of claim 8 further comprising activating the conductivity determining ions by a spike rapid thermal anneal.

10. The method of claim 9 further comprising:
    forming a gate electrode structure overlying the silicon substrate;
    embedding a region of silicon germanium in alignment with the gate electrode structure;
    implanting boron ions into and through the region of silicon germanium to form deep source and drain regions; and
    annealing the silicon substrate to activate the implanted ions.

11. The method of claim 8 further comprising co-implanting ions from the group consisting of carbon and fluorine with the conductivity determining ions.

12. The method of claim 8 wherein the silicon substrate comprises an N-type well region and implanting conductivity determining ions comprises implanting arsenic ions to form an N-type halo region and implanting boron ions to form source and drain extensions.

13. The method of claim 12 wherein the silicon substrate further comprises a P-type well region and implanting conductivity determining ions further comprises implanting boron ions into the P-type well region to form a P-type halo region and implanting arsenic ions into the P-type well region to form N-type source and drain extensions.

14. A method for fabricating an integrated circuit comprising:
    forming a gate electrode structure overlying a silicon substrate;
    embedding a region of silicon germanium into the silicon substrate in alignment with the gate electrode structure;

applying and patterning a layer of resist material overlying the silicon substrate and exposing a surface portion of the region of silicon germanium;

implanting N-type conductivity determining ions into the silicon substrate underlying a portion of the gate electrode structure using the layer of resist material as an ion implantation mask;

implanting P-type conductivity determining ions into the region of silicon germanium using the layer of resist material and the gate electrode structure as an ion implantation mask;

exposing the layer of resist material and the surface portion of the region of silicon germanium to a non-oxidizing plasma comprising hydrogen and nitrogen to remove the layer of resist material and to form a nitride layer on the surface portion of the region of silicon germanium; and thermally annealing to activate the implanted ions.

15. The method of claim 14 further comprising co-implanting ions from the group consisting of carbon and fluorine with the conductivity determining ions.

16. The method of claim 14 further comprising depositing a layer of stressed silicon nitride overlying the gate electrode structure.

17. The method of claim 14 wherein thermally annealing comprises rapid thermal annealing.

18. The method of claim 14 wherein exposing the layer of resist material and the surface portion to a non-oxidizing plasma comprises exposing the layer of resist material and the surface portion to plasma reactants selected from the group consisting of ammonia, hydrogen combined with nitrogen, and combinations thereof.

* * * * *